United States Patent [19]

Anthony et al.

[11] 4,101,759

[45] Jul. 18, 1978

[54] SEMICONDUCTOR BODY HEATER

[75] Inventors: Thomas R. Anthony; Harvey E. Cline, both of Schenectady; John O. Fielding, Ballston Lake; Carl A. Erikson, Schenectady, all of N.Y.

[73] Assignee: General Electric Company, Schenectady, N.Y.

[21] Appl. No.: 735,512

[22] Filed: Oct. 26, 1976

[51] Int. Cl.² .............................................. H05B 1/00
[52] U.S. Cl. .................................... 219/343; 219/347; 219/354; 219/405; 219/411
[58] Field of Search ............... 219/343, 354, 358, 347, 219/349, 411, 405; 240/47, 106.1, 106 R; 350/188

[56] References Cited

U.S. PATENT DOCUMENTS

| | | | |
|---|---|---|---|
| 2,050,429 | 8/1936 | Dorey et al. | 240/106 R |
| 2,099,034 | 11/1937 | Rolph | 240/106 R |
| 3,087,041 | 4/1963 | Vonk | 219/347 |
| 3,271,874 | 9/1966 | Oppenheimer | 219/354 X |
| 3,586,813 | 6/1971 | Cruickshank et al. | 219/347 X |
| 3,637,285 | 1/1972 | Stewart | 350/188 X |
| 3,836,751 | 9/1974 | Anderson | 219/354 X |
| 3,862,397 | 1/1975 | Anderson et al. | 219/354 X |
| 3,956,612 | 5/1976 | Ballard et al. | 219/342 X |
| 3,964,183 | 6/1976 | Mouat | 219/354 X |

FOREIGN PATENT DOCUMENTS 1,485,369  5/1967  France ................................. 350/188

OTHER PUBLICATIONS

Research Inc., "High Density Radiant Heater for Sustained High Temperature Operation", Data Bulletin D518.1.

Primary Examiner—Thomas J. Kozma
Attorney, Agent, or Firm—Donald M. Winegar; Joseph T. Cohen; Charles T. Watts

[57] ABSTRACT

A semiconductor body heater is provided with a planar array of radiant heating elements spaced from a reflector. In the preferred embodiment, each radiant heating element comprises a tungsten filament quartz lamp. Each lamp is removable and replaceable without disengaging any other lamp. The reflector is cooled by flows of gas and liquid coolant therethrough. Flows of gas between the planar array of lamps and the reflector and between the reflector and a cover member also cool the apparatus. Various diffusers for substantially eliminating temperature nonuniformities over an area illumined by the planar array of lamps are also disclosed. The semiconductor body heater of the present invention is particularly well suited for use in a temperature gradient zone melting process.

17 Claims, 11 Drawing Figures

SEMICONDUCTOR BODY HEATER

CROSS REFERENCES

This invention relates to the following U.S. Patent application assigned to the assignee of the present invention:

Patent application Ser. No. 735,513, filed Oct. 26, 1976, in the names of Thomas R. Anthony, Harvey E. Cline, John O. Fielding, and Carl A. Erikson and entitled "Furnace for Practicing Temperature Gradient Zone Melting" which discloses and claims a new and improved apparatus for maintaining a uniform temperature gradient across a plurality of semiconductor bodies undergoing processing by temperature gradient zone melting;

Patent application Ser. No. 796,367, filed May 12, 1977, in the names of Thomas R. Anthony, Harvey E. Cline, John O. Fielding, Siegwalt Ludke and Carl A. Erikson and entitled "Apparatus for Practicing Temperature Gradient Zone Melting" which discloses and claims an apparatus for the fully automatic practice of temperature gradient zone melting and Patent application Ser. No. 796,368, filed May 12, 1977, in the names of Thomas R. Anthony, Harvey E. Cline, John O. Fielding, Siegwalt Ludke and Carl A. Erikson and entitled "Apparatus for Practicing Temperature Gradient Zone Melting" which discloses and claims an apparatus for the fully automated practice of temperature gradient zone melting.

BACKGROUND OF THE INVENTION

1. Field of the Invention

This invention relates to an apparatus for heating semiconductor bodies during the processing thereof as in processing by temperature gradient zone melting.

2. Description of the Prior Art

In the manufacture of semiconductor devices, it is often necessary to alter or tailor the conductivity type of a body of semiconductor material. This alteration is achieved by distributing atoms of a conductivity modifying dopant in a selected region or selected regions of the body. Frequently, techniques employed to achieve that distribution require the heating of the semiconductor body.

Recently, it has been discovered that a preferred technique of altering the conductivity of a semiconductor body is the technique of temperature gradient zone melting. Early teachings of temperature gradient zone melting are found in U.S. Pat. No. 2,813,048 issued to W. G. Pfann and in a book by Pfann entitled Zone Melting (John Wiley and Sons, Inc., 1966). More recent applications of temperature gradient zone melting are disclosed and claimed in U.S. Pat. Nos. 3,899,361 and 3,899,362 to Thomas R. Anthony and Harvey E. Cline and assigned to the assignee of the present invention. The aforementioned U.S. Patents to Anthony and Cline are incorporated herein by reference. As taught in the aforementioned book by Pfann, temperature gradient zone melting involves the migration of a melt of a first material through a body of a second material under the influence of a temperature gradient maintained across the second material and finally a recrystallization of the melt after migration. In the application of temperature gradient zone melting to the production of semiconductor devices, the first material usually comprises a metal such as aluminim, tinaluminum alloy or gold-antimony alloy while the second material comprises a semiconductor material such as silicon, germanium or the like.

In his co-pending U.S. Patent Application Ser. No. 578,736, filed May 19, 1975, and now U.S. Pat. No. 4,001,047, entitled heating Apparatus For Temperature Gradient Zone Melting, John Boah discloses tungsten filament quartz lamps capable of emitting infra-red radiation as being suitable for establishing a temperature gradient in a temperature gradient zone melting process. This application is assigned to the assignee of the present invention and is incorporated herein by reference. Boah also discloses a radiant heater marketed by Research, Inc. of Minneapolis, Minn. which employs a planar array of such quartz lamps as being suitable. However, such a radiant heater is deficient in a number of respects. In the commercial manufacture of semiconductor devices, it is desirable to process as many devices at a time as possible. Moreover, it is desirable to employ a heat source wherein failure of one or more heating elements will not adversely affect the desired temperature gradient to a degree requiring the discarding of the semiconductor bodies being processed when the failure occurred. In a temperature gradient zone melting process, it is therefore desirable to employ a planar array of radiant heating elements of as large an overall area as possible. Prior art radiant heaters are capable of accommodating quartz lamps disposed in a planar array of only limited area. Exemplary is the aforementioned heater marketed by Research, Inc. which employs six GE 3200T, 3/1 CL Quartz Infrared Lamps marketed by General Electric in an array measuring approximately 18 inches by approximately 3 inches. Planar arrays of radiant heating elements of greater areas are required for the economic commercial production of semiconductor devices by temperature gradient zone melting.

Critical to the successful implementation to temperature gradient zone melting in the manufacture of semiconductor devices is the maintenance of a unidirectional temperature gradient across the semiconductor material. That is, for any desired direction of migration of the conductivity altering dopant through a body or wafer of semiconductor material, a temperature gradient across the body must be established in a direction as close to the desired direction as possible. The existence of temperature gradients in any other directions (lateral or oblique to the major surfaces of the wafer) will cause the migration of the dopant in these other directions thereby causing the resulting zone to be irregular or misdirected. Such zone geometries adversely affect the performance of the semiconductor device. Due to the spacing of lamps within a planar array thereof, temperatures may vary by as much as 40° C over distances as small as 1 cm in the area of illumination of the array. These temperature irregularities contribute to the aforementioned lateral or oblique temperature gradients. Constructing an array of suitable size for commercial production of semiconductor devices from a plurality of prior art heaters would significantly contribute to these lateral or oblique temperature gradients due to the relatively wide inter-lamp spacing between lamps disposed on the edges of two adjacent arrays.

Another source of temperature irregularities causing the adverse lateral or oblique temperature gradients described hereinabove is the failure or burn-out of a lamp or lamps within a planar array thereof. Therefore, it may be necessary to halt production of semiconductor devices to allow the servicing and replacement of the burned-out lamp. Such a halt in production would be uneconomical and therefore should be minimized in time duration. Prior art heaters require substantial disassembly for the replacement of a single lamp. In fact, the same disassembly may be required to replace one or a plurality of lamps. This substantial disassembly and the time required therefor, may add significantly to the cost of manufacturing semiconductor devices by temperature gradient zone melting.

In addition to the interlamp spacing, severe temperature irregulariities in the area of illumination of a lamp array will be caused by the construction of the lamps themselves. Direct observation of such an array through solar filters has indicated that these irregularities in temperature are due to the self shadowing effect of the coiled tungsten filament, the shadowing of the disk-shaped filament holders disposed within the quartz envelope and the refractive properties of the quartz envelopes. Prior art quartz lamp heaters employ no means for minimizing these temperature irregularities, which irregularities if of a great enough value, could cause the misdirection of the melt zones thereby adversely affecting the semiconductor device being produced.

Other sources of temperature irregularities and the corresponding lateral and oblique temperature gradients produced thereby are the position of a semiconductor wafer relative to the center of the area of illumination of the lamp array and the finite size of the array. Since each lamp emits infrared radiation over a particular angular range, a semiconductor wafer disposed in the center of the area of illumination will be irradiated by a plurality of lamps. However, a wafer disposed near the edge of the area of illumination will be irradiated by a lesser number of lamps. Therefore, when a plurality of wafers are being processed, the temperature gradients impressed across wafers positioned at the center and edges of the area of illumination will differ causing a non-uniformity in the migration of the melt zones within two such wafers. Moreover, the varying temperatures within the finite area of illumination will cause lateral or oblique temperature gradients to be impressed across the wafers being irradiated.

The dependence of the infrared transmissivity of quartz upon the angle of incidence which the radiation makes with the quartz also produces temperature irregularities in the radiation emitted by the lamps and therefore lateral or oblique temperature gradients resulting from those temperature irregularities. In prior art radiant heaters, each lamp filament must emit to the semiconductor wafers through at least two layers of quartz, one being the quartz envelope of the lamp and the other being a quartz cover plate of an air cooling channel disposed around the lamps. Therefore the transmissivity of the quartz envelopes and coverplate will vary over the angular range of radiation emitted by a lamp causing temperature irregularities and the resulting lateral or oblique temperature gradients over this range.

Therefore, it is an object of the present invention to provide a new and improved semiconductor body heater which overcomes the deficiencies of the prior art.

It is another object of the present invention to provide a new and improved semiconductor body heater capable of irradiating an area of sufficient size for the large scale commercial manufacture of semiconductor devices.

It is another object of the present invention to provide a new and improved semiconductor body heater wherein an individual heating element employed therein may be readily removed and replaced without disturbing any other heating elements.

It is another object of the present invention to provide a new and improved semiconductor body heater wherein temperature irregularities over an area heated by the heater are minimized.

SUMMARY OF THE INVENTION

These and other objects apparent from the following detailed description taken in connection with the appended claims and accompanying drawings are attained by providing a semiconductor body heater with a planar array of tungsten filament quartz lamps spaced from a reflector. In addition, a lamp is provided in proximity to each side of the planar lamp array but offset from the plane of the array so as to be disposed adjacent the outer edge of an array of semiconductor bodies being irradiated. These lamps minimize temperature irregularities at the outer edges of the area illuminated by the lamp array. Each lamp makes electrical connections with and is supported by opposed terminal plates such that each lamp is removable and replaceable without disturbing any other lamps. The input power to each lamp is individually variable to compensate for temperature irregularities in the area of illumination of the array. To further compensate for such temperature irregularities, the semiconductor body heater of the present invention may employ one of a plurality of suitable diffusers. The diffuser may be a quartz plate frosted on at least one major surface thereof, a quartz plate frosted and annealed to form a random distribution of spherical projections on at least one major surface thereof or may comprise a parallel array of quartz rods fused together. In addition to the quartz diffuser, a quartz convection suppressor plate may be interposed between the lamps and the body being irradiated to minimize free convective cooling of the semiconductor bodies, thereby allowing the lamps to be operated at reduced input power, effectively extending the useful life of the lamps.

The reflector is cooled by flows of cooling gas and liquid coolant therethrough. The quartz lamp envelopes are cooled by a flow of cooling gas thereover. Flows of cooling gas between the planar array of lamps and the reflector and between the reflector and a cover member also cool the apparatus.

DESCRIPTION OF THE PREFERRED EMBODIMENT

Figure 1:
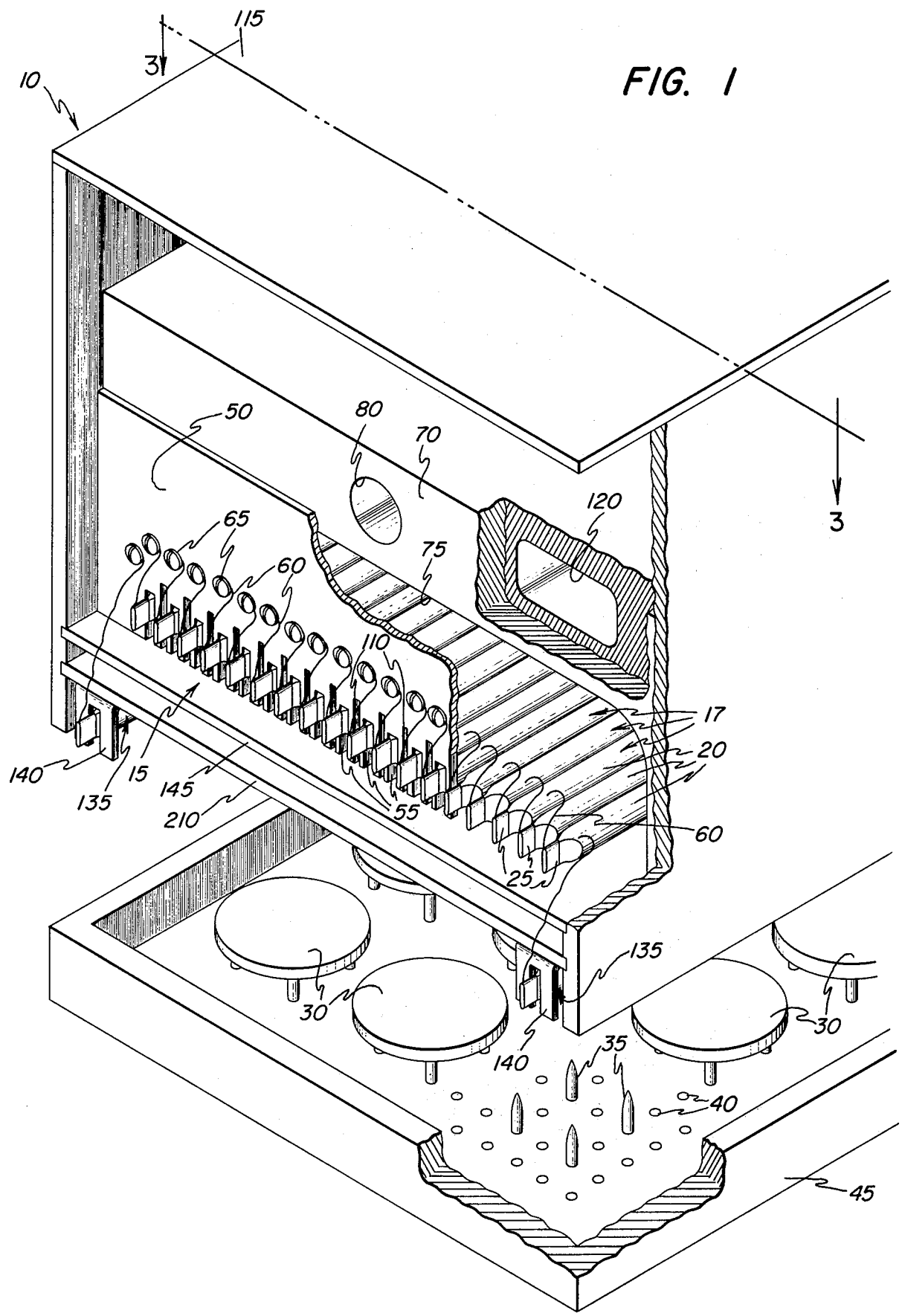
FIG. 1 is a three-dimensional view partially sectioned and broken away of one end of the semiconductor body heater of the present invention, a heat sink employed therewith and a number of semiconductor bodies being irradiated by the heater.
Figure 2:
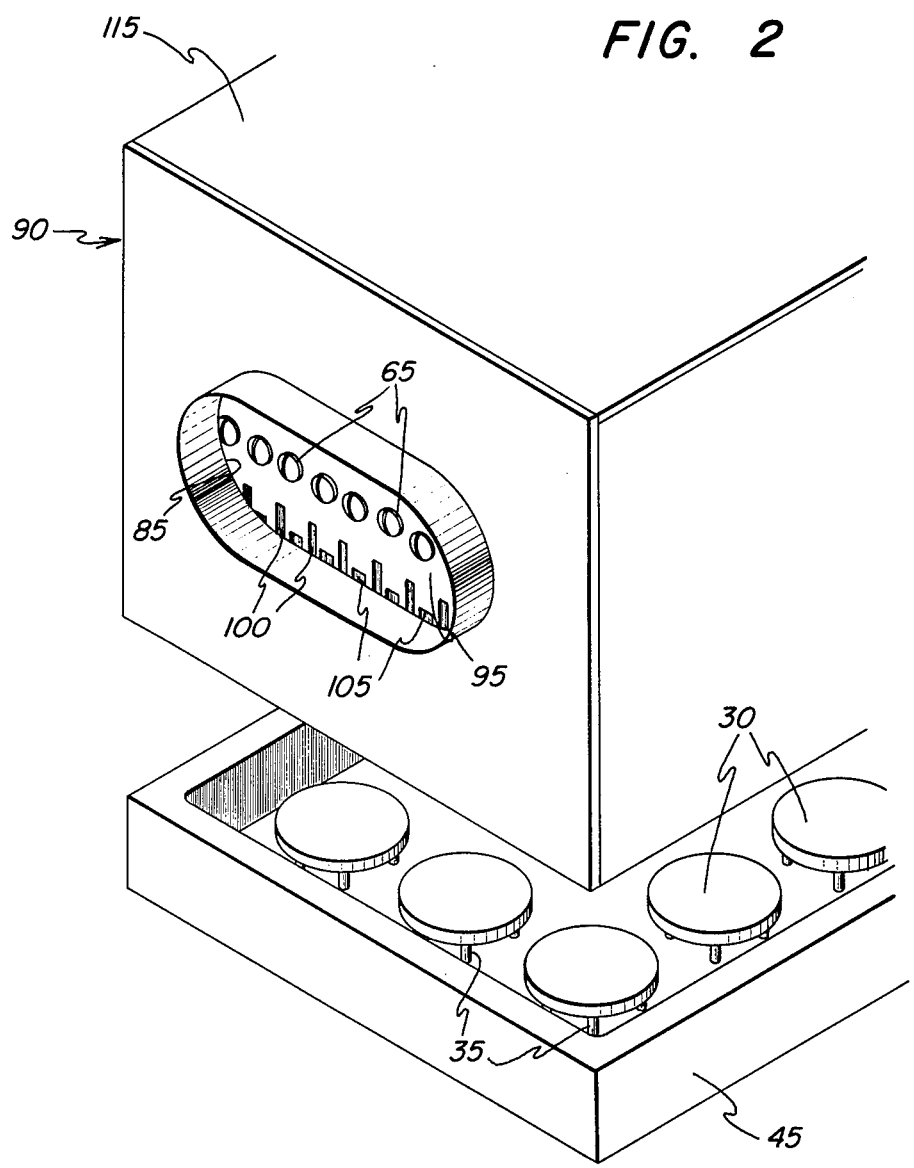
FIG. 2 is a reduced three-dimensional view of an end of the semiconductor body heater of the present invention opposite to that shown in FIG. 1.
Figure 3:
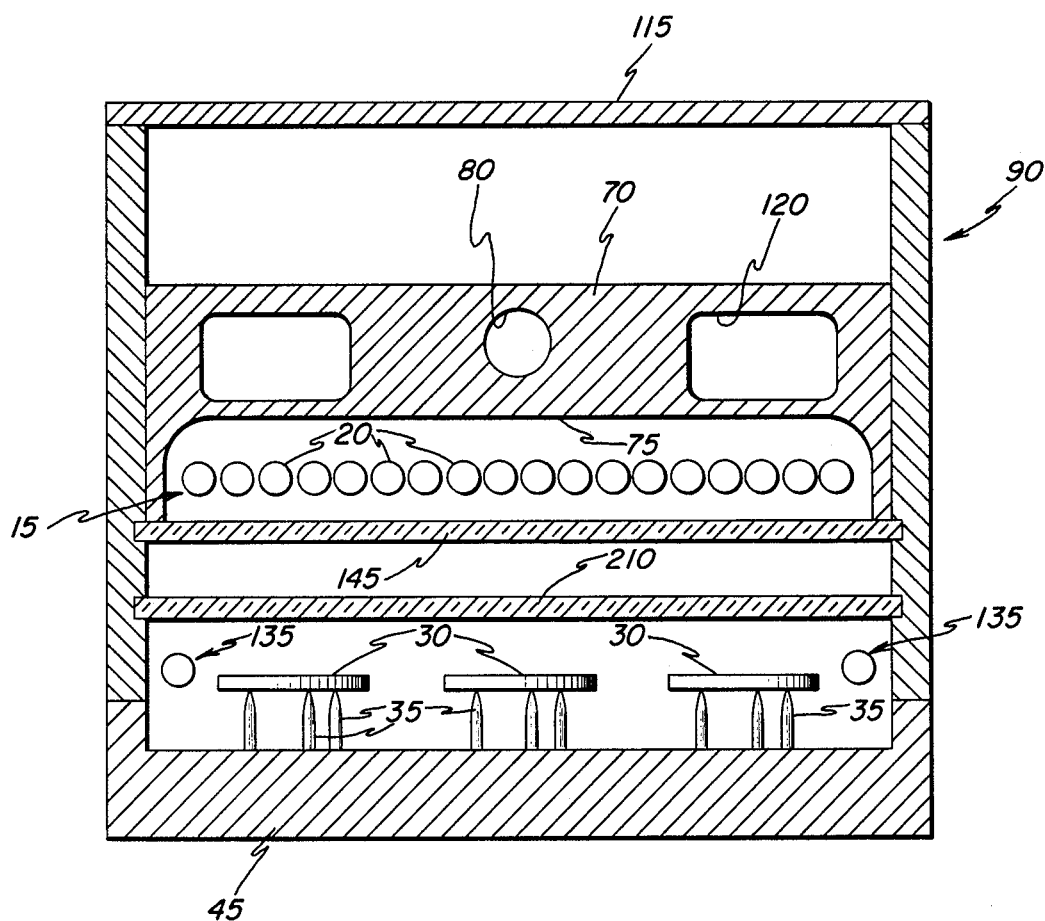
FIG. 3 is a sectional view taken along line 3—3 of FIG. 1.

Referring to FIGS. 1, 2 and 3 there is shown a semiconductor body heater 10, comprising a planar array 15 of radiant heating elements which emit infrared radiation. It has been found that suitable radiant heating elements comprise tungsten filament quartz lamps 17. Each lamp includes a cylindrical quartz envelope 20 and at each end thereof, a metal seal 25. The array of lamps 15 is disposed directly above a plurality of semiconductor wafers 30 supported upon refractory pins 35 seated within cavities 40 provided in a heat sink 45. The heat sink and refractory pins form no part of the present invention. Lamp array 15 and heat sink 45 cooperate to impress a temperature gradient across semiconductor bodies 30, that gradient causing the migration of a zone of conductivity altering dopant (not shown) through wafers 30. While planar lamp array 15 is shown including 18 lamps, it will be understood that more or fewer lamps may be employed to meet requirements for the commercial manufacture of semiconductor devices from wafers 30.

Each of the lamps of planar array 15 are mounted in part to a terminal plate 50, the seals 25 of each lamp fitting within a corresponding slot 55 disposed in one edge of terminal plate 50. Each of the lamps has a connecting wire 60 at each end thereof, the connecting wire making electrical contact to a corresponding terminal screw 65. Therefore, it will be seen that each lamp is supported by the engagement of seal 25 with slots 55 and connecting wire 60 with terminal screw 65. Each lamp is therefore individually removable and replaceable, without removing or in any way disturbing any other lamps. Therefore, the time requirement to replace a burned out lamp is minimized thereby enhancing the efficiency and economy of the production of the semiconductor devices.

To maximize the radiation emitted by the lamps and impinging upon wafers 30, a reflector 70 is disposed adjacent to and spaced from the lamps on a side of the array opposite that side facing the wafers 30. Reflector 70 includes a reflective surface 75 and is cooled by a flow of cooling gas through first coolant passage 80 disposed in a central portion of reflector 70 and extending the length thereof. Cooling gas is introduced to first coolant passage 80 at an opposite end of the semiconductor body heater through an aperture 85 in a housing 90 for the heater. Also, illustrated in FIG. 2 is a second terminal plate 95 substantially the same as terminal plate 50 shown in FIG. 1. Cooling gas introduced through aperture 85 also flows through slots 100 and 105 in second terminal plate 95, flows around the lamp envelopes and metal seals, 20 and 25 respectively, through a passage partially defined by reflective surface 75, and exits the apparatus through slots 55 and 110 in first terminal plate 50. This cooling gas effectively cools the lamps of planar array 15 and thereby eliminates any separation between envelopes 20 and metal seals 25 due to thermal distortion of these members. Additionally, cooling air entering aperture 85 flows over the top of reflector 70 through a passage defined by the reflector and a cover member 115 employed in housing 90.

Figure 4:
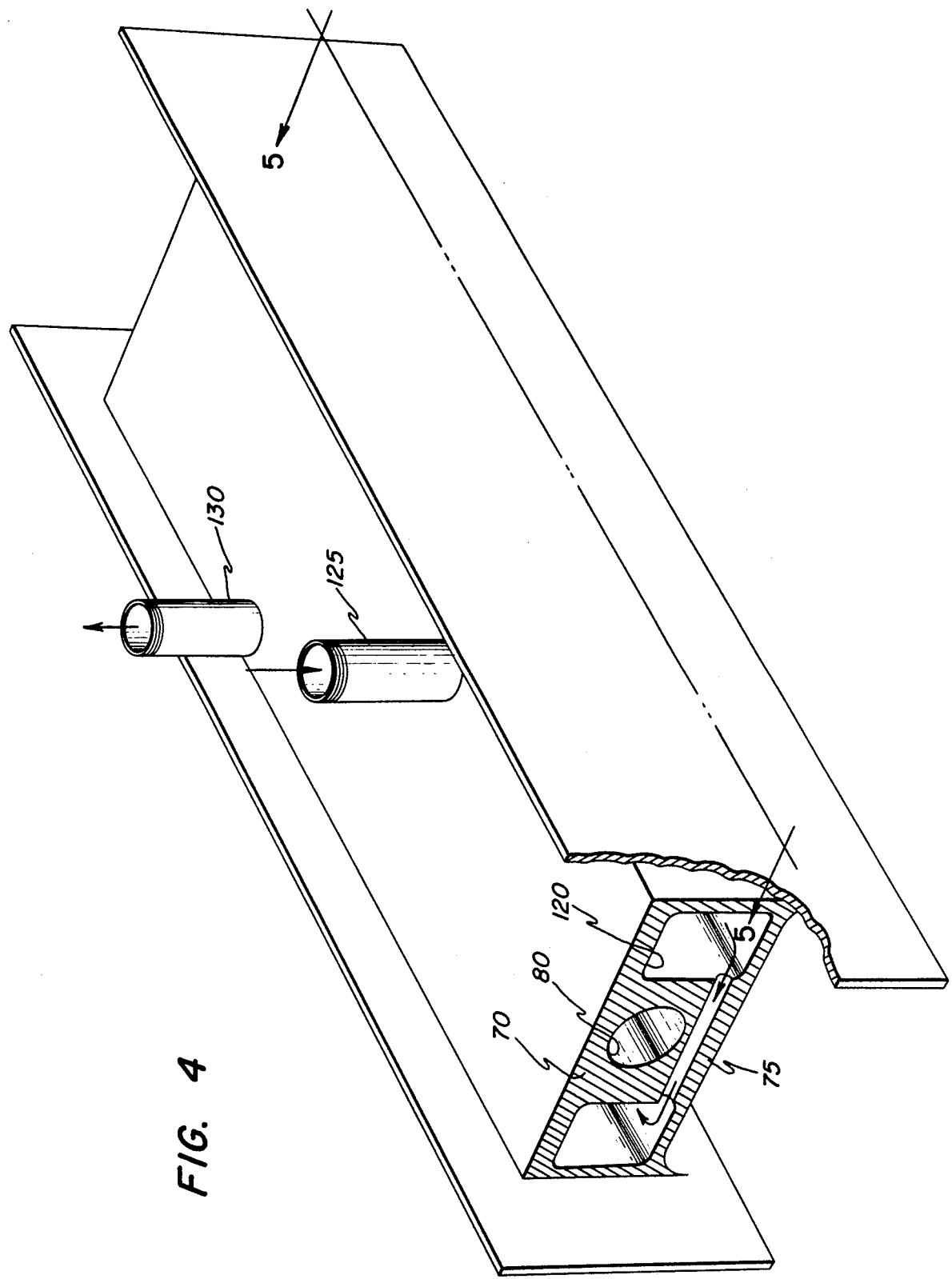
FIG. 4 is a three-dimensional view partially sectioned and broken away of a reflector employed in the semiconductor body heater of the present invention.
Figure 5:
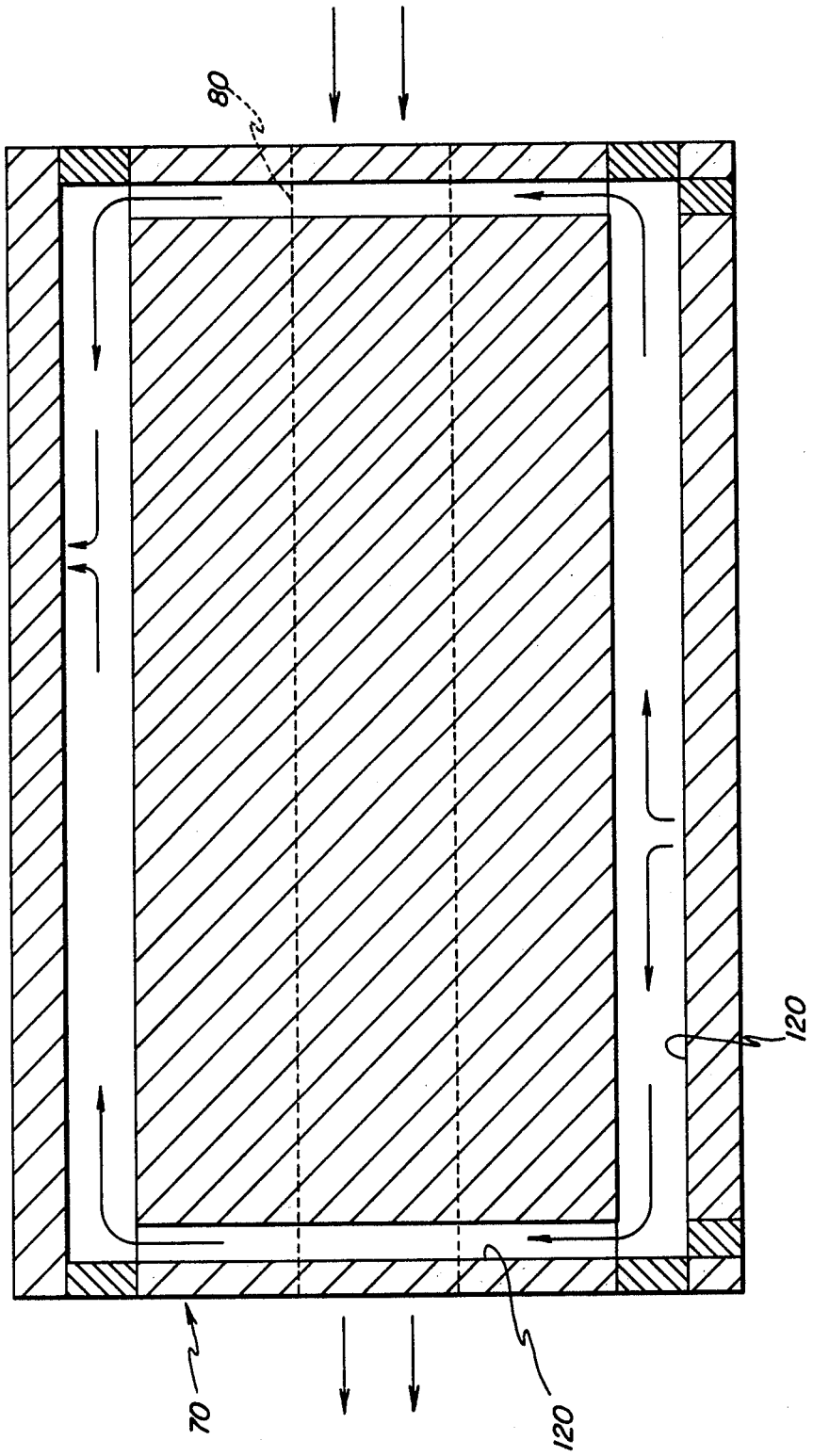
FIG. 5 is a sectional view taken along line 5—5 of FIG. 4.

Referring now to FIGS. 1, 3, 4 and 5, reflector 70 is also provided with a second coolant channel 120 which is disposed in proximity and parallel to the sides and ends of reflector 70. Referring specifically to FIGS. 4 and 5, liquid coolant enters second coolant passage 120, the flow divides and circulates through passage 120 to outlet pipe 130 connected to a suitable drain (not shown).

Again referring to FIGS. 1 and 3, to provide a uniform, properly directed temperature gradient at the edge of the array of semiconductor bodies being heated and further to minimize lateral or oblique temperature gradients, lamps 135 are disposed in proximity to the sides of lamp array 15 but offset from the plane of that array so as to be disposed adjacent the outer edges of the semiconductor body array when the semiconductor body heater is operated. Lamps 135 are received within mounting brackets 140 and make electrical connections to terminal plates 50 and 95 in a manner substantially the same as the lamps of planar array 15.

Figure 6:
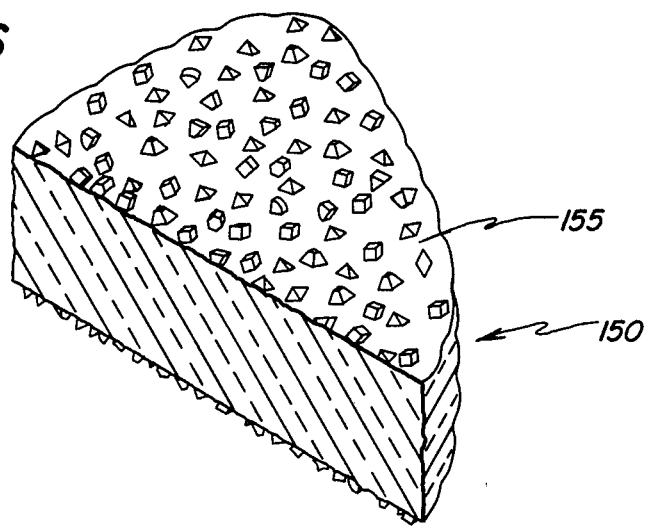
FIG. 6 is an enlarged partially sectioned and broken away view of a diffuser employed with the semiconductor body heater of the present invention.

To reduce temperature irregularities and the lateral or oblique temperature gradients associated with those irregularities, the semiconductor body heater of the present invention employes a diffuser 145 adjacent to and in a plane parallel with planar lamp array 15. Diffuser 145 also functions to block the flow of cooling gas around the lamp envelopes from wafers 30. FIG. 6 illustrates one embodiment of a diffuser employed in the semiconductor body heater of the present invention. Diffuser 150 comprises a quartz sheet with at least one irregular major surface 155 formed by either sandblasting or etching with a highly concentrated acid. Infrared light emitted by lamp array 15 is scattered by the irregular or frosted surface thereby causing each semiconductor wafer 30 to be irradiated by a greater number of lamps than would be the case were no diffuser used. In this manner, temperature irregularities in the area of illumination of the planar lamp array are effectively cancelled thereby substantially eliminating associated lateral or oblique temperature gradients.

Figure 7:
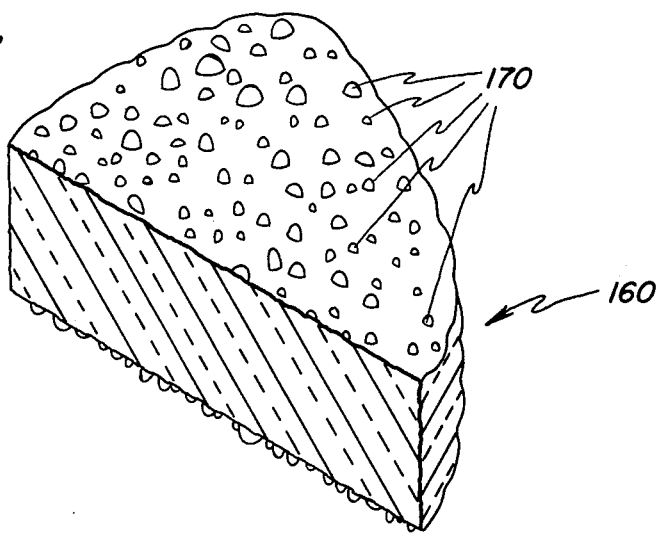
FIG. 7 is an enlarged partially sectioned and broken away view of an alternate diffuser employed with the semiconductor body heater of the present invention.

FIG. 7 illustrates an alternate embodiment of a diffuser useful in the semiconductor body heater of the present invention. This diffuser 160 comprises a quartz sheet which has been frosted by either sandblasting or etching and then annealed to form on at least one surface thereof a multiplicity of randomly distributed generally spherical projections 170. Refraction by projections 170 of infrared radiation emitted by planar lamp array 15 produces a random orientation of closely spaced virtual sources beneath the diffuser. In operation of the diffuser, each wafer is irradiated by a multiplicity of such virtual sources thereby effectively cancelling temperature irregularities in the area of illumination of the lamp array.

Figure 8:
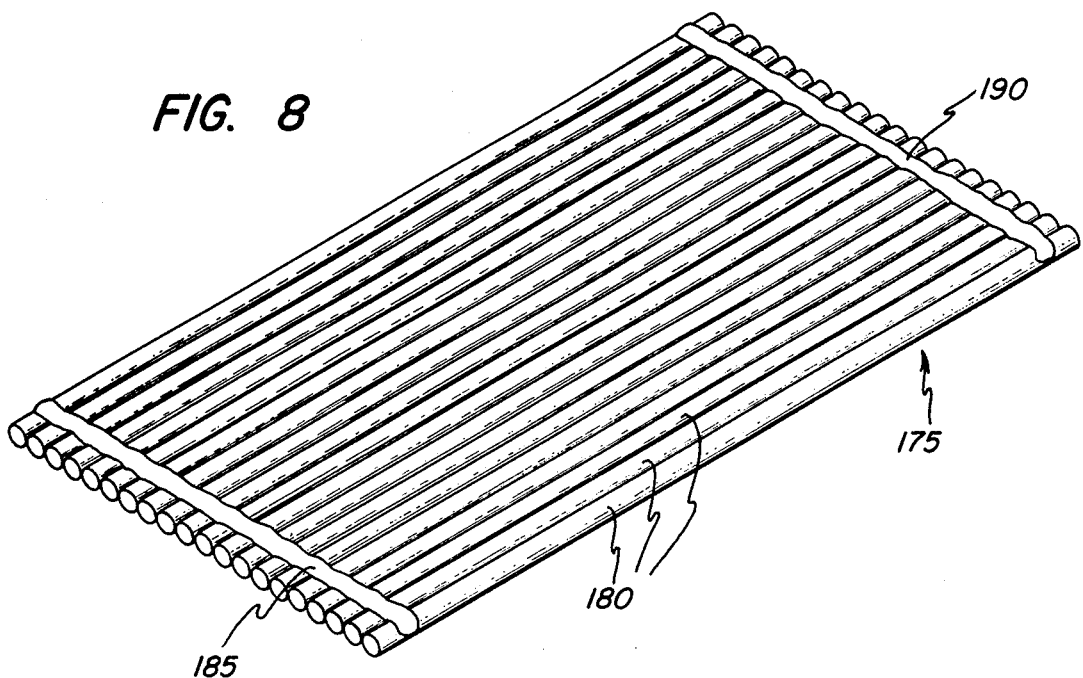
FIG. 8 is a view of an alternate diffuser employed with the semiconductor body heater of the present invention.
Figure 9:
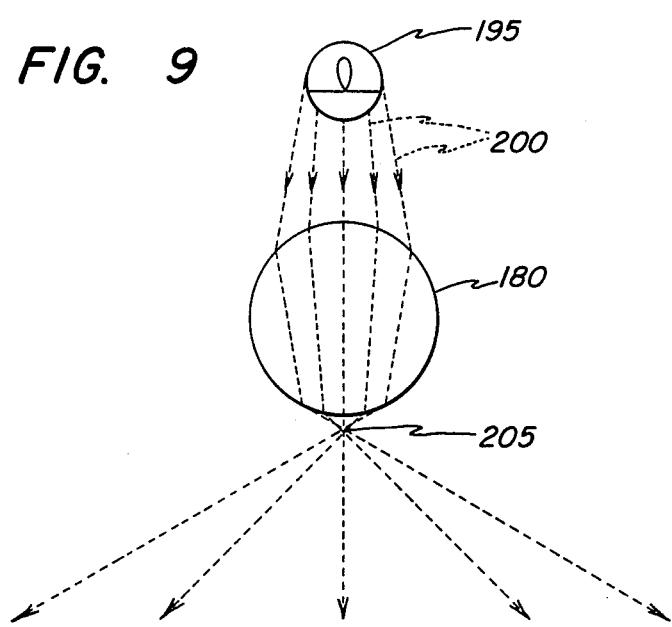
FIG. 9 is a schematic diagram illustrating the diffusion of infrared radiation by one of a plurality of quartz rods employed in the second alternate diffuser illustrated in FIG. 8.

FIGS. 8 and 9 illustrate a second alternate embodiment of a diffuser which may be employed with the semiconductor body heater of the present invention.

Diffuser 175 comprises a planar array of parallel quartz rods 180 fusion bonded together as at 185 and 190. The diffraction of infrared radiation by each rod is illustrated in FIG. 9. Referring now to FIG. 9, a quartz lamp or actual source 195 emits radiation represented by arrows 200, which radiation is refracted by quartz rod 180 creating a virtual source 205 on an opposite side of the rod as lamp 195. It has been found that for an interlamp spacing of 1 cm, rods of 1 mm diameter will create virtual sources spaced 1 millimeter apart, the virtual sources emitting radiation of a high angular dispersion. The creation of such a large number of closely spaced virtual sources emitting radiation of such a high angular dispersion causes each wafer to be irradiated by a multiplicity of such virtual sources thereby effectively canceling temperature irregularities in a direction perpendicular to the rod axes and the resulting lateral or oblique temperature gradients.

It has been found that semiconductor wafers irradiated by an infrared source such as planar array 15 may cool by free convection thereby creating in the wafers lateral or oblique temperature gradients. To substantially eliminate this free convection cooling, the semiconductor body heater of the present invention is provided with a convection supressor plate 210 spaced from planar lamp array 15 and arranged so as to be interposed between the lamp array and the bodies of semiconductor material. It has been found that a quartz convection suppressor plate disposed 1 millimeter above the semiconductor wafers 30 substantially eliminates any free convective cooling of the wafers thereby reducing the necessary output intensity of radiation and input power to the quartz lamps. Such a reduction of required input power to the lamps effectively lengthens the useful life of the lamps enhancing the economy of the semiconductor devices manufactured.

Figure 10:
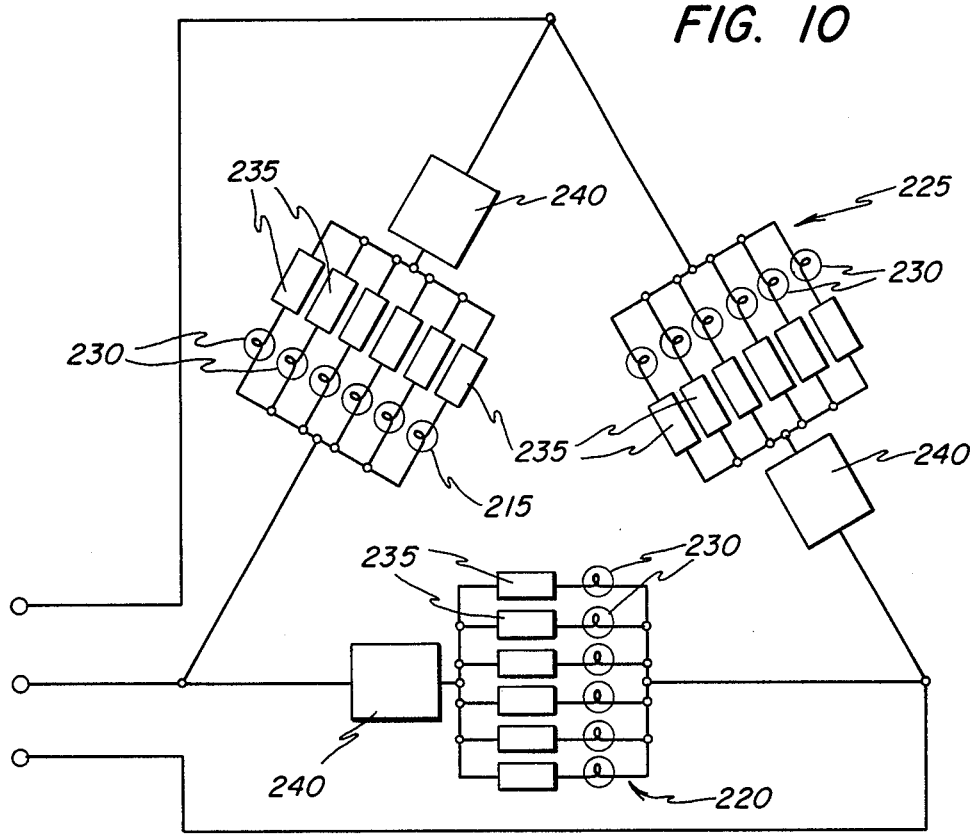
FIG. 10 is a schematic diagram illustrating the electrical connections to the lamps employed in the semiconductor body heater of the present invention.

Suitable electrical connections for the lamps of planar array 15 are shown in FIG. 10 wherein three banks of lamps 215, 220 and 225 are connected in a delta arrangement across a suitable three-phase power supply (not shown). Each lamp 230 is connected in series with a suitable input power controller 235 so that the input power and therefore the intensity of radiation emitted by the lamps may be individually controlled for the reduction of temperature irregularities in the area of illumination of the lamps. It has been found that a suitable SCR power controller Cat. No. LN1-4870ADT is sold by Leeds and Northrop Inc., North Wales, Pa. Additionally, to provide further control over the intensity of radiation emitted by the lamps, each bank may be connected in series with a single input power controller 240 similar to the input power controllers 235 to control the intensity of radiation emitted by an entire bank of lamps.

Figure 11:
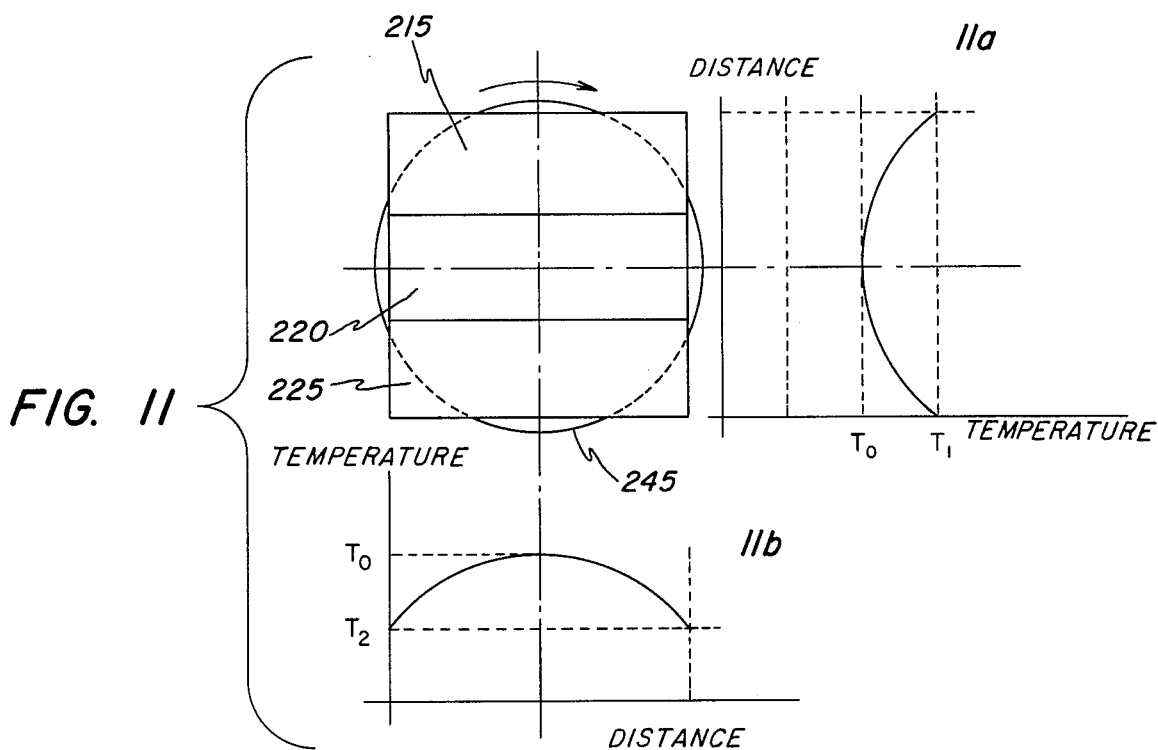
FIG. 11 is a schematic representation of the temperature distribution across the lamps when connected as in FIG. 10.

An arrangement particularly suitable for the utilization of input power controllers 235 and 240 is shown in FIG. 11. In FIG. 11, lamp banks 215, 220 and 225 are disposed in a side-by-side arrangement over a rotatable turntable 245. A plurality of semiconductor wafers are placed on turntable 245 and the turntable is rotated beneath the banks of lamps so that each semiconductor body will experience a plurality of temperature irregularities which in effect cancel each other to ensure a proper direction of zone migration. This method of moving the semiconductor bodies to minimize the adverse effects of temperature irregularities is disclosed and claimed in U.S. Pat. application Ser. No. 733,238 filed Oct. 18, 1976 now U.S. Pat. No. 4,081,293 in the names of Harvey E. Cline and Thomas R. Anthony and entitled "Uniform Thermomigration Utilizing Sample Movement". This application is incorporated herein by reference. To further enchance the canceling of lateral and oblique temperature gradients by exposure of the semiconductor bodies to a multiplicity of such gradients for brief periods of time, input power controllers 235 and/or 240 may be adjusted so that the intensity of illumination emitted by banks 215 and 225 is substantially higher than the intensity of radiation emitted by lamp bank 220. Therefore, a temperature distribution in a direction perpendicular to the axes of the lamps within the banks will appear as approximately shown in FIG. 11a wherein the temperature $T_0$ at the center of lamp bank 220 will be lower than temperature $T_1$ at the outer edges of banks 215 and 225. Due to the finite size of the three bank array and the angle of dispersion of radiation emitted by each lamp, a temperature distribution in a direction parallel to the axes of the individual lamps is shown in FIG. 11b wherein a temperature at the ends of the array $T_2$ is lower than the temperature $T_0$ at the center of the three bank array. This "saddle point" temperature distribution enhances the self canceling of the lateral temperature gradients experienced by the rotating wafers. For example, a semiconductor wafer placed on turntable 245 and rotated with turntable 245 will experience at a 0° angular position a temperature gradient directed radially inward and at an angular position of 90° an oppositely directed temperature gradient of the same magnitude. These temperature gradients will effectively cancel each other to ensure a proper direction of migration of the molten zone.

Although input power controllers are shown for controlling power to an entire bank of lamps and to individual lamps, it will be understood that the same results may be achieved with only input power controllers 235 connected in series to each lamp and the additional connection of input power controller 240 to each bank of lamps may not be required.

Therefore, it can be seen that the semiconductor body heater of the present invention overcomes the deficiencies of radiant heaters found in the prior art. The provisions of suitable cooling by both air and liquid coolant allows the semiconductor body heater of the present invention to be manufactured in any suitable size for the commercial production of semiconductor devices. Each infrared emitting lamp is individually serviceable and replaceable without the disconnection or any other disturbance of the other lamps enabling the heater of the present invention to be quickly and economically serviced. The provisions of lamps for irradiating the edges of an array of semiconductor bodies, the suitable diffusers, and the input power controllers for each lamp or a bank of lamps enables the infrared radiation emitted by the heater of the present invention to be tailored to minimize temperature irregularities in the area of illumination of the lamps and the lateral or oblique temperature gradients resulting from those irregularities.

While there have been shown and described various embodiments of the semiconductor body heater of the present invention it will be apparent to those skilled in the art that modifications may be made without departing from the substance of this invention and it is intended by the appended claims to cover such modifications as come within the spirit and scope of this invention.

What is claimed is:

1. A heater for processing one or more bodies of semiconductor material by temperature gradient zone melting, said heater comprising:
   a planar array of radiant heating elements, having two opposed sides and said array being oriented in a plane parallel to the one or more bodies of semiconductor material;
   means for mounting said radiant heating elements wherein each of said radiant heating elements is individually removable and replaceable without disengaging any other radiant heating element from said mounting means;
   said means for mounting said radiant heating elements comprises first and second terminal plates, each of said terminal plates being slotted in a plurality of locations along one edge thereof, said slots accommodating the ends of said radiant heating elements and having cooling gas passages therethrough located between said ends of said radiant heating elements to provide a longitudinal means for cooling each of the elements, said terminal plates including a plurality of electrical terminals, each of said terminals being electrically connected to one of said radiant heating elements;
   a reflector, disposed parallel to and spaced from one side of said planar array of radiant heating elements, said reflector being provided with internal cooling passages and a polished reflective surface and including first and second sides and first and second ends, and
   said internal coolant passages within said reflector comprise a first coolant passage adapted to accommodate a flow of cooling gas and a second coolant passage adapted to accommodate a flow of liquid coolant.

2. The heater of claim 1 wherein said radiant heating elements comprise tungsten filament quartz lamps.

3. The heater of claim 1 wherein the input power to each of said radiant heating elements is individually adjustable.

4. The heater of claim 3 wherein those of said radiant heating elements disposed in a central portion of said planar array are adapted to draw a lower value of input power than those of said radiant heating elements disposed on the edges of said planar array.

5. The heater of claim 1 and further including at least one additional radiant heating element disposed in proximity to each side of said planar array in a plane spaced from the plane of said planar array, each of said additional radiant heating elements extending in a direction parallel to the radiant heating elements of said planar array and so arranged that said additional radiant heating elements and said planar array of radiant heating elements provide a uniform temperature distribution in said plane spaced from said planar array.

6. The heater of claim 1 wherein said first coolant passage comprises a generally straight channel extending through said reflector substantially in the center thereof.

7. The heater of claim 1 wherein said second coolant passage comprises a channel having portions thereof extending parallel to and in proximity to said sides and said ends of said reflector.

8. The heater of claim 1 wherein said reflector includes a reflective surface partially defining a passage for a flow of cooling gas through said heater.

9. The heater of claim 8 and further including a cover member disposed adjacent to and spaced from said reflector, said cover member and said reflector defining a passage for a flow of cooling air therebetween.

10. The heater of claim 1 and further including a diffuser spaced from said radiant heating elements said diffuser and said reflector defining a volume which contains said radiant heating elements, said diffuser enhancing the uniformity of the radiant energy flux delivered by the heater.

11. The heater of claim 10 wherein said diffuser comprises a flat plate of quartz frosted on at least one major surface thereof.

12. The heater of claim 10 wherein said diffuser comprises a planar array of parallel quartz rods fusion bonded together, each of said quartz rods extending in a direction parallel to said radiant heating elements.

13. The heater of claim 10 wherein said diffuser comprises a sheet of quartz frosted and annealed on at least one major surface thereof, to form on said major surface a multiplicity of generally spherical projections.

14. The heater of claim 1 and further including a convection suppressor plate spaced from said planar array of radiant heating elements and arranged so as to be disposed outwardly of said radiant heating elements, said convection suppressor plate being transmissive to radiation emitted by said radiant heater and substantially eliminating any free convection cooling of said bodies of semiconductor material during said temperature gradient zone melting.

15. The heater of claim 14 wherein said convection suppressor plate is of quartz.

16. The heater of claim 10 and further including a convection suppressor plate spaced from said diffuser and arranged so as to be disposed outwardly of said diffuser, said convection suppressor plate being transmissive to radiation emitted by said radiant heater and substantially eliminating any free convection cooling of said bodies of semiconductor material during said temperature gradient zone melting.

17. The heater of claim 16 wherein said convection suppressor plate is of quartz.

* * * * *